United States Patent
Morgan et al.

(10) Patent No.: US 7,061,323 B2
(45) Date of Patent: Jun. 13, 2006

(54) APPARATUS AND METHOD FOR CONTROLLING OPERATION OF AN AMPLIFIER DEVICE WHEN SUPPLY VOLTAGE VARIES

(75) Inventors: Mark W. Morgan, Allen, TX (US); Yanli Fan, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 103 days.

(21) Appl. No.: 10/921,496

(22) Filed: Aug. 19, 2004

(65) Prior Publication Data

US 2006/0038616 A1    Feb. 23, 2006

(51) Int. Cl.
*H03F 3/04* (2006.01)
(52) U.S. Cl. .................... 330/261; 330/296
(58) Field of Classification Search ............ 330/261, 330/296, 257
See application file for complete search history.

(56) References Cited

U.S. PATENT DOCUMENTS 4,887,048 A * 12/1989 Krenik et al. ............... 330/261
5,381,113 A * 1/1995 Kimura ...................... 330/261

* cited by examiner

*Primary Examiner*—Khanh Van Nguyen
(74) *Attorney, Agent, or Firm*—W. James Brady, III; Frederick J. Telecky, Jr.

(57) ABSTRACT

An apparatus for controlling operation of an amplifier device when supply voltage provided to the amplifier device varies at an input voltage supply locus. The amplifier device has an operating parameter varying in generally direct proportion with the supply voltage. The apparatus includes: (a) a reference parameter supply providing a reference parameter; (b) a modeling circuit coupled with the input voltage supply locus that models the amplifier device; (c) a comparing circuit coupled with the modeling circuit and the reference parameter supply that compares a model operating parameter from the modeling circuit and the reference parameter and provides a control signal to the modeling circuit and the amplifier device in response to the comparing; the control signal alters operation of the modeling circuit and the amplifier device to reduce variance between the reference parameter and the model operating parameter from a predetermined relationship.

20 Claims, 4 Drawing Sheets

APPARATUS AND METHOD FOR CONTROLLING OPERATION OF AN AMPLIFIER DEVICE WHEN SUPPLY VOLTAGE VARIES

BACKGROUND OF THE INVENTION

The present invention is directed to signal amplifier devices, and especially to differential signal amplifier devices. Supply voltages in amplifier devices are decreasing as efforts to create products having lower power requirements continue. Lower power requirements contribute to longer battery life, less heat generation and other advantages that are particularly useful in small, compact products. Differential signal amplifiers are experiencing a trend toward lower supply voltages, especially as differential signal amplifiers are increasingly manufactured to meet the Low Voltage Differential Signaling (LVDS) and Low Voltage Positive Emitter Coupled Logic (LVPECL) standards. Performance of amplifier devices, including LVDS and LVPECL amplifiers exhibits significant variation in various operational parameters as supply voltage varies.

If a particular amplifier is employed using a variety of supply voltages, there may be unacceptable variance in such operational parameters as gain, output voltage (e.g., output differential voltage, $V_{od}$, in LVDS and LVPECL amplifiers), and edge rate (a measure of definition of a signal edge). By way of example and not by way of limitation, as supply voltage drops, bias current drops. As a consequence of lower bias current, gain drops, $V_{od}$ is reduced and speed is reduced. As gain is reduced, edge rate deteriorates.

There is a need for an apparatus and method to operate an amplifier device at substantially constant operational parameters over a range of supply voltages. In particular, there is a need for an apparatus and method for compensating operating current in an amplifier when supply voltage varies.

CROSS REFERENCE TO COPENDING APPLICATIONS

Applicants have previously disclosed an apparatus and method for compensating operating current in an amplifier when supply voltage varies in U.S. patent application Ser. No. 10/796,954, filed Mar. 19, 2004, for "Apparatus and Method for Compensating Operating Current in an Amplifier When Supply Voltage Varies"; assigned to the Assignee of the present application. In that earlier-filed application, the supply voltage was monitored. When a sufficient reduction in the supply voltage was noted, a supplemental current is provided to the tail current $I_{TAIL}$ of an amplifier device.

The present invention differs from the invention disclosed in the above-cited copending application principally in that a modeled tail current is employed for deciding when to supplement tail current $I_{TAIL}$ in an amplifier device.

SUMMARY OF THE INVENTION

An apparatus for controlling operation of an amplifier device when supply voltage provided to the amplifier device varies at an input voltage supply locus. The amplifier device has an operating parameter varying in generally direct proportion with the supply voltage. The apparatus includes: (a) a reference parameter supply providing a reference parameter; (b) a modeling circuit coupled with the input voltage supply locus that models the amplifier device; (c) a comparing circuit coupled with the modeling circuit and the reference parameter supply that compares a model operating parameter from the modeling circuit and the reference parameter and provides a control signal to the modeling circuit and the amplifier device in response to the comparing; the control signal alters operation of the modeling circuit and the amplifier device to reduce variance between the reference parameter and the model operating parameter from a predetermined relationship.

A method for controlling operation of an amplifier device when supply voltage provided to the amplifier device changes sufficiently at an input voltage supply locus to vary an operating parameter in the amplifier device from a predetermined value; the operating parameter varying in generally direct proportion with the supply voltage; includes the steps of: (a) in no particular order: (1) providing a modeling circuit coupled with the input voltage supply locus; the modeling circuit producing a model operating parameter substantially modeling the operating parameter; (2) providing a reference parameter supply; the reference parameter supply providing a reference parameter; and (3) providing a comparing circuit coupled with the reference parameter supply and coupled with the modeling circuit; (b) operating the comparing circuit to compare the model operating parameter with the reference parameter; (c) providing a control signal from the comparing circuit to the modeling circuit and to the amplifier device in response to the comparing; the control signal altering operation of the modeling circuit and the amplifier device to change the model operating parameter when the model operating parameter differs from the predetermined value to reduce difference between the model operating parameter and the predetermined value.

It is, therefore, an object of the present invention to provide an apparatus and method to operate an amplifier device at substantially constant operational parameters over a range of supply voltages.

It is a further object of the present invention to provide an apparatus and method for compensating operating current in an amplifier when supply voltage varies.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
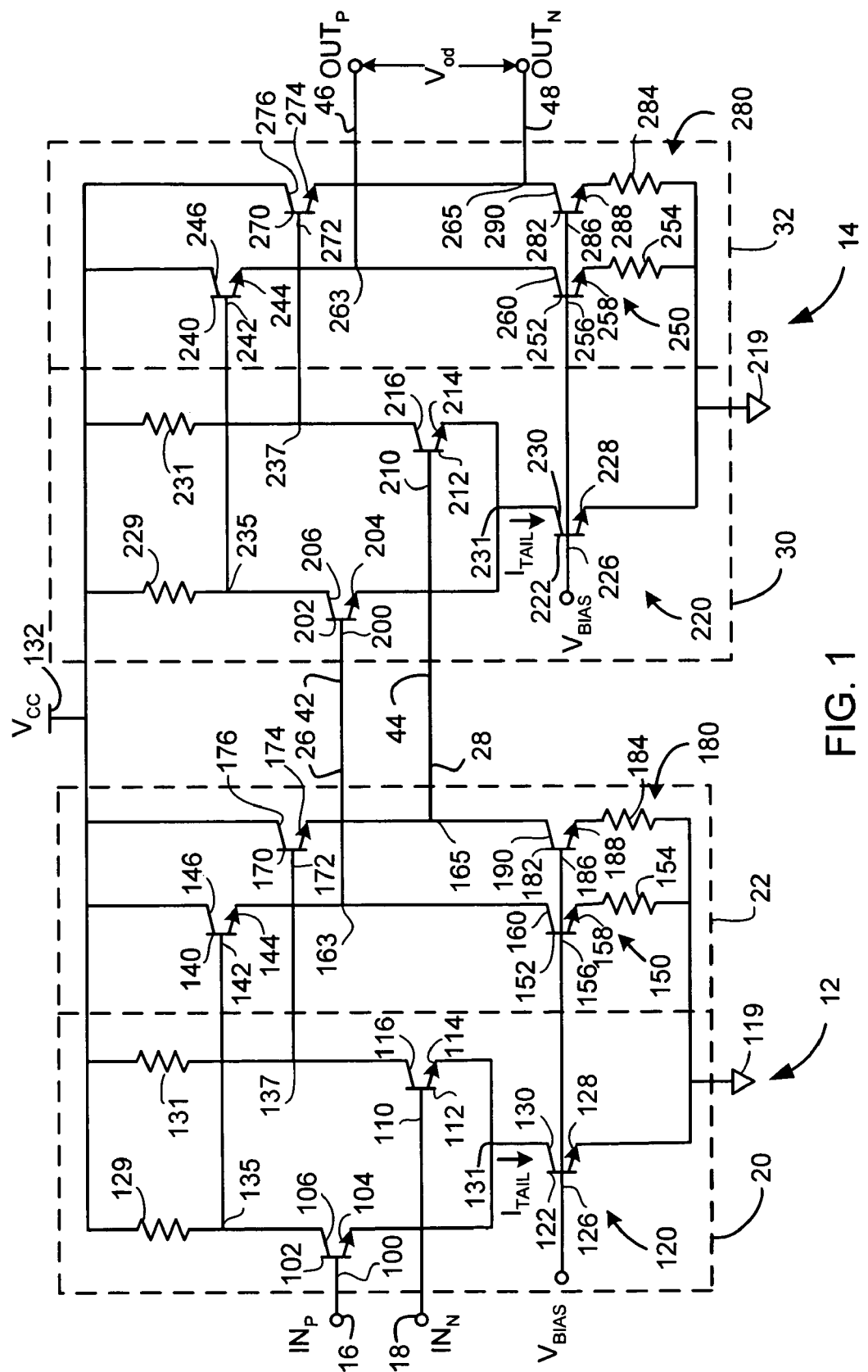
FIG. 1 is an electrical schematic diagram of a prior art differential signal amplifier.

FIG. 1 is an electrical schematic diagram of a prior art differential signal amplifier. In FIG. 1, a differential signal amplifier 10 has a first stage 12 and a second stage 14. First stage 12 includes a first amplifier stage 20 and a first level shift circuit 22. Second stage 14 includes a second amplifier stage 30 and a second level shift circuit 32.

First stage 12 receives a positive input signal $IN_P$ at input locus 16 and receives a negative input signal $IN_N$ at input locus 18. Input locus 16 is coupled with a base 100 of an NPN transistor 102. Transistor 102 has an emitter 104 and a collector 106. Input locus 18 is coupled with a base 110 of an NPN transistor 112. Transistor 112 has an emitter 114 and a collector 116. Emitters 104, 114 are coupled with ground 119 via a bias circuit 120. Bias circuit 120 includes an NPN transistor 122. Transistor 122 has a base 126, an emitter 128 and a collector 130. Collector 130 is coupled with emitters 104, 114. Emitter 128 is coupled with ground 119. A bias voltage $V_{BIAS}$ is applied to base 126 to control conducting operation by transistor 122. Collectors 106, 116 are coupled with an input voltage supply locus 132 via resistors 129, 131.

A follower transistor 140 has a base 142, an emitter 144 and a collector 146. Base 142 is coupled with a connection locus 135 between collector 106 and resistor 129. Collector 146 is coupled with supply voltage $V_{CC}$ at input voltage supply locus 132. Emitter 144 is coupled with ground 119 via a bias circuit 150. Bias circuit 150 includes an NPN transistor 152 and a resistor 154 coupled in series. Transistor 152 has a base 156, an emitter 158 and a collector 160. Collector 160 is coupled with emitter 144. Emitter 158 is coupled with resistor 154. A bias voltage $V_{BIAS}$ is applied to base 156 to control conducting operation by transistor 152.

A follower transistor 170 has a base 172, an emitter 174 and a collector 176. Base 172 is coupled with a connection locus 137 between collector 116 and resistor 131. Collector 176 is coupled with supply voltage $V_{CC}$ at input voltage supply locus 132. Emitter 174 is coupled with ground 119 via a bias circuit 180. Bias circuit 180 includes an NPN transistor 182 and a resistor 184 coupled in series. Transistor 182 has a base 186, an emitter 188 and a collector 190. Collector 190 is coupled with emitter 174. Emitter 188 is coupled with resistor 184. A bias voltage $V_{BIAS}$ is applied to base 186 to control conducting operation by transistor 182. Output locus 26 is coupled with a connection locus 163 between collector 160 and emitter 144. Output locus 28 is coupled with a connection locus 165 between collector 190 and emitter 174.

Second stage 14 receives a first input signal from output locus 26 at input locus 42 and receives a second input signal from output locus 28 at input locus 44. Input locus 42 is coupled with a base 200 of an NPN transistor 202. Transistor 202 has an emitter 204 and a collector 206. Input locus 44 is coupled with a base 210 of an NPN transistor 212. Transistor 212 has an emitter 214 and a collector 216. Emitters 204, 214 are coupled with ground 219 via a bias circuit 220. Bias circuit 220 includes an NPN transistor 222. Transistor 222 has a base 226, an emitter 228 and a collector 230. Collector 230 is coupled with emitters 204, 214. Emitter 228 is coupled with ground 219. A bias voltage $V_{BIAS}$ is applied to base 226 to control conducting operation by transistor 222. Collectors 206, 216 are coupled with input voltage supply locus 132 via resistors 229, 231.

A follower transistor 240 has a base 242, an emitter 244 and a collector 246. Base 242 is coupled with a connection locus 235 between collector 206 and resistor 229. Collector 246 is coupled with supply voltage $V_{CC}$ at input voltage supply locus 132. Emitter 244 is coupled with ground 219 via a bias circuit 250. Bias circuit 250 includes an NPN transistor 252 and a resistor 254 coupled in series. Transistor 252 has a base 256, an emitter 258 and a collector 260. Collector 260 is coupled with emitter 244. Emitter 258 is coupled with resistor 254. A bias voltage $V_{BIAS}$ is applied to base 256 to control conducting operation by transistor 252.

A follower transistor 270 has a base 272, an emitter 274 and a collector 276. Base 272 is coupled with a connection locus 237 between collector 216 and resistor 231. Collector 276 is coupled with supply voltage $V_{CC}$ at input voltage supply locus 132. Emitter 274 is coupled with ground 219 via a bias circuit 280. Bias circuit 280 includes an NPN transistor 282 and a resistor 284 coupled in series. Transistor 282 has a base 286, an emitter 288 and a collector 290. Collector 290 is coupled with emitter 274. Emitter 288 is coupled with resistor 284. A bias voltage $V_{BIAS}$ is applied to base 286 to control conducting operation by transistor 282.

Output locus 46 is coupled with a connection locus 263 between collector 260 and emitter 244. Output locus 48 is coupled with a connection locus 265 between collector 290 and emitter 274. Output signal $OUT_P$ is presented at output locus 46. Output signal $OUT_N$ is presented at output locus 48. The potential difference between output loci 46, 48 is differential output voltage $V_{od}$.

Gain of first amplifier stage 20 is generally directly variable with respect to tail current $I_{TAIL}$ that traverses transistors 102, 112. Differential output voltage $V_{od}$ and speed of first amplifier stage 20 are also directly variable with respect to tail current $I_{TAIL}$. Tail current $I_{TAIL}$ may also be viewed as the bias current that traverses bias transistor 122. When supply voltage $V_{CC}$ drops to a sufficiently low level, bias transistor 122 saturates and consequently current $I_{TAIL}$ through transistors 102, 112 is reduced. When tail current $I_{TAIL}$ at locus 131 in first amplifier stage 20 goes down, gain goes down, differential output voltage $V_{od}$ goes down and speed of first amplifier stage 20 goes down.

This effect is also manifested in second amplifier stage 30. Gain of second amplifier stage 30 is generally directly variable with respect to tail current $I_{TAIL}$ that traverses transistors 202, 212. Differential output voltage $V_{od}$ and speed of second amplifier stage 30 are also directly variable with respect to tail current $I_{TAIL}$. Tail current $I_{TAIL}$ may also be viewed as the bias current that traverses bias transistor 222. When supply voltage $V_{CC}$ drops to a sufficiently low level, bias transistor 222 saturates and consequently current $I_{TAIL}$ through transistors 202, 212 is reduced. When tail current $I_{TAIL}$ at locus 231 in second amplifier stage 30 goes down, gain goes down, differential output voltage $V_{od}$ goes down and speed of second amplifier stage 30 goes down.

Expressed in mathematical format:

$$\text{Gain} \sim I_{TAIL} \quad [1]$$

$$V_{od} \sim I_{TAIL} \quad [2]$$

When gain is low, the output signals at output loci 46, 48 exhibit a less-defined edge than is presented when gain is high. Also, as mentioned earlier herein, speed is reduced as supply voltage $V_{CC}$ is reduced. Speed reduction occurs because a lower supply voltage $V_{CC}$ causes a lower tail current $I_{TAIL}$ so that there is a lower current density in transistors 102, 112 (first amplifier stage 20) and in transistors 202, 212 (second amplifier stage 30). The speed of transistors is only optimized with a certain optimized current density. Lower tail current $I_{TAIL}$ reducing current density to less than the optimized current density is manifested in a lower speed of operation.

Figure 2:
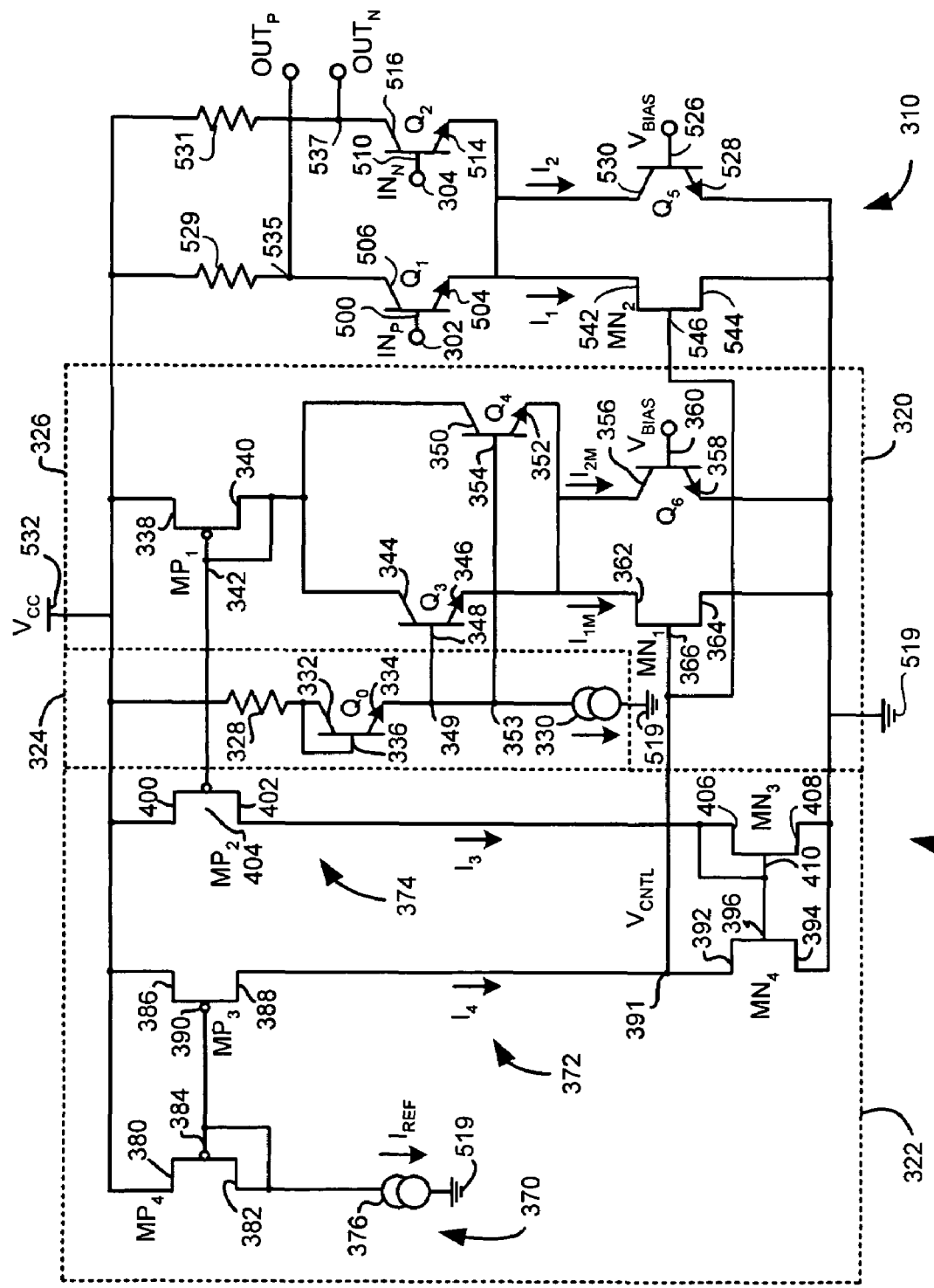
FIG. 2 is an electrical schematic diagram of the preferred embodiment of the apparatus of the present invention.

FIG. 2 is an electrical schematic diagram of the preferred embodiment of the apparatus of the present invention. In FIG. 2, an apparatus 300 is configured for controlling operation of an amplifier device 310. Amplifier device 310 is substantially similar to second amplifier stage 30 (FIG. 1). Amplifier device 310 receives a positive input signal $IN_P$ at input locus 302 and receives a negative input signal $IN_N$ at input locus 304. Input locus 302 is coupled with a base 500 of an NPN transistor Q. Transistor $Q_1$ has an emitter 504 and a collector 506. Input locus 304 is coupled with a base 510 of an NPN transistor $Q_2$. Transistor $Q_2$ has an emitter 514 and a collector 516. Emitters 504, 514 are coupled with ground 519 via an NPN transistor $Q_5$. Transistor $Q_5$ has a base 526, an emitter 528 and a collector 530. Collector 530 is coupled with emitters 504, 514. Emitter 528 is coupled with ground 519. A bias voltage $V_{BIAS}$ is applied to base 526 to control conducting operation by transistor $Q_5$. Collectors 506, 516 are coupled with an input voltage supply locus 532 via resistors 529, 531. Emitters 504, 514 are also coupled with ground 519 via an NMOS transistor $MN_2$. Transistor $MN_2$ has a drain 542, a source 544 and a gate 546. Drain 542 is coupled with emitters 504, 514. Source 544 is coupled with ground 519.

Apparatus 300 also includes a modeling circuit 320 and a comparing circuit 322. Modeling circuit 320 includes an input modeling section 324 and an amplifier modeling section 326. Input modeling section 324 is configured to model input signals $IN_P$, $IN_N$ received at input loci 302, 304 in amplifier device 310. Input signals $IN_P$, $IN_N$ are received from an amplifier stage preceding amplifier device 310, in the manner of input signals received at input loci 42, 44 (FIG. 1). Input modeling section 324 includes a resistor coupled in series with an NPN transistor $Q_0$ and a current source 330 between input voltage supply locus 532 and ground 519. Transistor $Q_0$ has a collector 332, an emitter 334 and a base 336. Transistor $Q_0$ is diode configured with collector 332 and gate 336 connected together.

Amplifier modeling section 326 includes a PMOS transistor $MP_1$ coupled with input voltage supply locus 532. Transistor $MP_1$ has a source 338, a drain 340 and a gate 342. Source 338 is coupled with input voltage supply locus 532. Drain 340 is coupled with a pair of parallel-connected NPN transistors $Q_3$, $Q_4$. Transistor $Q_3$ has a collector 344, an emitter 346 and a base 348. Transistor $Q_4$ has a collector 350, an emitter 352 and a base 354. Collectors 344, 350 are coupled with drain 340. Base 348 is coupled with a locus 349 between transistor $Q_0$ and current source 330. Base 354 is coupled with a locus 353 between transistor $Q_0$ and current source 330. In this manner, bases 348, 354 receive substantially the same modeled input signals. Emitters 346, 352 are coupled with ground 519 via an NPN transistor $Q_6$. Transistor $Q_6$ has a collector 356, an emitter 358 and a base 360. Collector 356 is coupled with emitters 346, 352. Emitter 358 is coupled with ground 519. A bias voltage $V_{BIAS}$ is applied to base 360 to control conducting operation by transistor $Q_6$. Emitters 346, 352 are also coupled with ground 519 via an NMOS transistor $MN_1$. Transistor $MN_1$ has a drain 362, a source 364 and a gate 366. Drain 362 is coupled with emitters 346, 352. Source 364 is coupled with ground 519.

Comparing circuit 322 includes a first circuit branch 370, a second circuit branch 372 and a third circuit branch 374 coupled in parallel between input voltage supply locus 532 and ground 519. First circuit branch 370 includes a PMOS transistor $MP_4$ and a reference current supply 376. Transistor $MP_4$ has a source 380, a drain 382 and a gate 384. Source 380 is coupled with input voltage supply locus 532. Reference current supply 376 is coupled between drain 382 and ground 519. Second circuit branch 372 includes a PMOS transistor $MP_3$ and an NMOS transistor $MN_4$. Transistor $MP_3$ has a source 386, a drain 388 and a gate 390. Transistor $MN_4$ has a drain 392, a source 394 and a gate 396. Source 386 is coupled with input voltage supply locus 532. Drain 388 is coupled with drain 392. Source 394 is coupled with ground 519. Third circuit branch 374 includes a PMOS transistor $MP_2$ and an NMOS transistor $MN_3$. Transistor $MP_2$ has a source 400, a drain 402 and a gate 404. Transistor $MN_3$ has a drain 406, a source 408 and a gate 410. Source 400 is coupled with input voltage supply locus 532. Drain 402 is coupled with drain 406. Source 408 is coupled with ground 519.

For purposes of this disclosure the term "model" relates to a representation of an apparatus or a portion of an apparatus. A model may be rendered in a 1:1 scale or in a scale other than 1:1. Modeling circuit 320 may be configured as a circuit substantially replicating amplifier device 310. Alternatively, modeling circuit 320 may be configured as a larger scale circuit representing amplifier device 310. Preferably, modeling circuit 320 is configured as a small scale circuit representing amplifier device. Using such a small scale representation reduces board space and power requirements in a product as compared to using a 1:1 or larger scale representation of amplifier device 310.

Input modeling section may also be configured using values for resistor 328 and transistor $Q_0$ to substantially replicate input signals $IN_P$, $IN_N$ received at input loci 302, 304 in amplifier device 310, or to represent input signals $IN_P$, $IN_N$ in a different scale than a 1:1 scale. The voltage supply signal $V_{CC}$ provided at input voltage supply locus 532 is the same voltage supply signal provided to earlier amplifier stages, provided to modeling circuit 320 and provided to amplifier device 310. Thus, when voltage supply signal $V_{CC}$ varies, it affects previous amplifier stages (not shown in FIG. 2), amplifier device 310 and all portions of apparatus 300, except that reference current supply 376 operates substantially independently of supply voltage $V_{CC}$.

Current flowing through transistor $MP_1$ is equal to the sum of current flowing through transistor $MN_1$ (model current $I_{1M}$) and current flowing through transistor $Q_6$ (model current $I_{2M}$). Values and configurations for transistors in modeling circuit 320 (i.e., transistors $MP_1$, $MN_1$, $Q_3$, $Q_4$, $Q_6$) are selected to model amplifier device 310 so that model current $I_{1M}$ flowing through transistor $MN_1$ is a model of current $I_1$ in amplifier device 310 and model current $I_{2M}$ flowing through transistor $Q_6$ is a model of current $I_2$ in amplifier device 310.

Tail current $I_{TAIL}$ in amplifier device 310 is the sum of currents $I_1$, $I_2$. The sum of model currents $I_{1M}$, $I_{2M}$ thus establishes a model tail current $I_{TAIL-M}$. Model tail current $I_{TAIL-M}$ flows through transistor $MP_1$.

PMOS transistors $MP_1$, $MP_2$, $MP_3$, $MP_4$ and NMOS transistors $MN_3$, $MN_4$ are connected to establish certain current mirror configurations. Because of such current mirror configurations, Current $I_{REF}$ flowing in first circuit branch 370 is mirrored into second circuit branch 372 as current $I_4$. Model tail current $I_{TAIL-M}$ flowing through transistor $MP_1$ is mirrored into third circuit branch 374 as current $I_3$.

If supply voltage $V_{CC}$ goes known, $I_{TAIL}$ in amplifier device 310 (i.e., the sum of current s $I_1$, $I_2$) will go down. A reduction of supply voltage $V_{CC}$ will also affect modeling circuit 320—including both input modeling section 324 and amplifier modeling section 326. Input modeling section 324 will respond to a reduction of supply voltage $V_{CC}$ by reducing input signals from loci 349, 353 to transistors $Q_3$, $Q_4$. Because the previous amplifier section (not shown in FIG. 2) from which amplifier device 310 also operates using the same supply voltage signal $V_{CC}$, input signals $IN_P$, $IN_N$ received at input loci 302, 304 will reduce. Proper selection of components in input modeling section 324 ensures that reduction of input signals to transistors $Q_3$, $Q_4$ models reduction of input signal $IN_P$, $IN_N$ at input loci 302, 304. Such modeling of input signals $IN_P$, $IN_N$ by input signals to transistors $Q_3$, $Q_4$ enhances accuracy of modeling of tail current $I_{TAIL}$ by model tail current $I_{TAIL-M}$.

Amplifier modeling section 326 will respond to a reduction of supply voltage $V_{CC}$ by reducing model tail current $I_{TAIL-M}$ by an amount related to the reduction of tail current $I_{TAIL}$ in amplifier device 310 (the relation of the reduction of model tail current $I_{TAIL-M}$ to tail current $I_{TAIL}$ depends upon the model scale employed).

Recall that current $I_4$ is constant because reference current supply 376 operates substantially independently of supply voltage $V_{CC}$ and reference current $I_{REF}$ is mirrored to second circuit branch 372 as current $I_4$. When model tail current $I_{TAIL-M}$ reduces in response to reduction in supply voltage $V_{CC}$, the reduced model tail current $I_{TAIL-M}$ is mirrored into third circuit branch 374 as a reduced current $I_3$. Circuit branches 372, 374 are configured as a comparator, so a reduction in current $I_3$ will result in generation of a voltage $V_{CNTL}$ at a locus 391 in second circuit branch 372. Voltage $V_{CNTL}$ is applied as a control voltage to gate 366 (transistor $MN_1$) and to gate 546 (transistor $MN_2$). Gating transistor $MN_1$ increases model current $I_{1M}$, thus increasing model tail current $I_{TAIL-M}$. Gating transistor $MN_2$ increases current $I_1$, thereby increasing tail current $I_{TAIL}$. Increased model tail current $I_{TAIL-M}$ flows through transistor $MP_1$ and is reflected as an increased current $I_3$, thereby reducing the difference between currents $I_3$, $I_4$ and reducing the level of voltage $V_{CNTL}$. Transistors $MN_1$, $MN_2$ are gated to a lesser degree by the reduced level of voltage $V_{CNTL}$. The amount of change of model tail current $I_{TAIL-M}$ and tail current $I_{TAIL}$ is reduced as the difference between currents $I_3$, $I_4$ is reduced. The feedback system from transistor $MP_1$ through comparing circuit 322, via voltage $V_{CNTL}$ and transistors $MN_1$, $MN_2$ corrects changes in tail current $I_{TAIL}$ that occur as a result of a changes in supply voltage $V_{CC}$.

Figure 3:
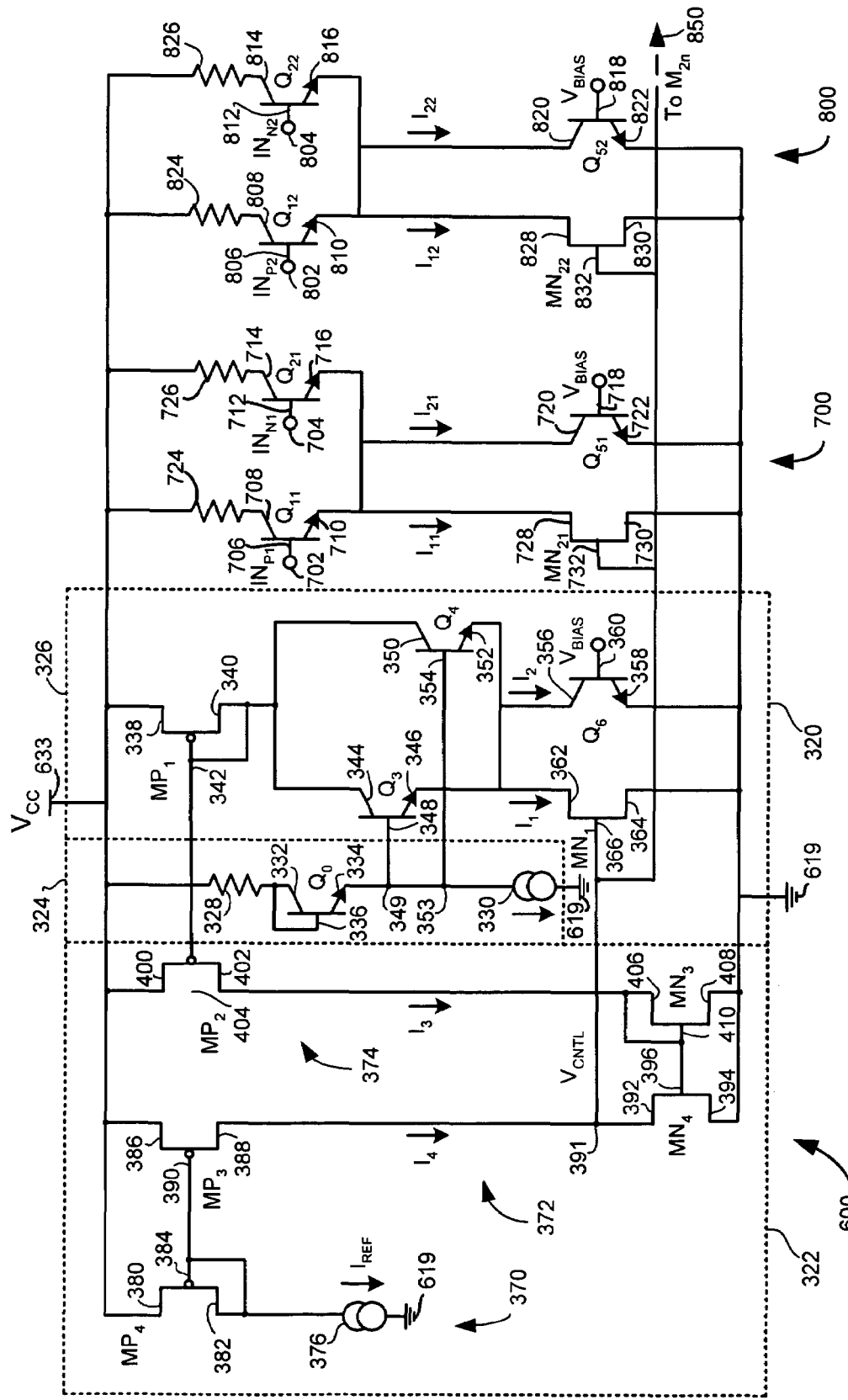
FIG. 3 is an electrical schematic diagram of the apparatus of the present invention employed with a multi-stage differential signal amplifier.

FIG. 3 is an electrical schematic diagram of the apparatus of the present invention employed with a multi-stage differential signal amplifier. In FIG. 3, an apparatus 600 is configured for controlling operation of amplifier devices 700, 800. Amplifier devices 700, 800 are substantially similar to second amplifier stage 30 (FIG. 1). Amplifier device 700 receives a positive input signal $IN_{P1}$ at input locus 702 and receives a negative input signal $IN_{N1}$ at input locus 704. Input locus 702 is coupled with a base 706 of an NPN transistor $Q_{11}$. Transistor $Q_{11}$ has a collector 708 and an emitter 710. Input locus 704 is coupled with a base 712 of an NPN transistor $Q_{21}$. Transistor $Q_{21}$ has a collector 714 and an emitter 716. Emitters 710, 716 are coupled with ground 619 via an NPN transistor $Q_{51}$. Transistor $Q_{51}$ has a base 718, a collector 720 and an emitter 722. Collector 720 is coupled with emitters 710, 716. Emitter 722 is coupled with ground 619. A bias voltage $V_{BIAS}$ is applied to base 718 to control conducting operation by transistor $Q_{51}$. Collectors 708 714 are coupled with an input voltage supply locus 633 via resistors 724, 726. Emitters 710, 716 are also coupled with ground 619 via an NMOS transistor $MN_{21}$. Transistor $MN_{21}$ has a drain 728, a source 730 and a gate 732. Drain 728 is coupled with emitters 710, 716. Source 730 is coupled with ground 619.

Amplifier device 800 receives a positive input signal $IN_{P2}$ at input locus 802 and receives a negative input signal $IN_{N2}$ at input locus 804. Input locus 802 is coupled with a base 806 of an NPN transistor $Q_{12}$. Transistor $Q_{12}$ has a collector 808 and an emitter 810. Input locus 804 is coupled with a base 812 of an NPN transistor $Q_{22}$. Transistor $Q_{22}$ has a collector 814 and an emitter 816. Emitters 810, 816 are coupled with ground 619 via an NPN transistor $Q_{52}$. Transistor $Q_{52}$ has a base 818, a collector 820 and an emitter 822. Collector 820 is coupled with emitters 810, 816. Emitter 822 is coupled with ground 619. A bias voltage $V_{BIAS}$ is applied to base 818 to control conducting operation by transistor $Q_{52}$. Collectors 808, 814 are coupled with an input voltage supply locus 633 via resistors 824, 826. Emitters 810, 816 are also coupled with ground 619 via an NMOS transistor $MN_{22}$. Transistor $MN_{22}$ has a drain 828, a source 830 and a gate 832. Drain 828 is coupled with emitters 810, 816. Source 830 is coupled with ground 619.

Apparatus 600 may be employed in connection with multiple downstream amplifier stages, as indicated by an arrow 350 to illustrate providing voltage $V_{CNTL}$ to downstream transistors $M_{2n}$. It is preferable that all amplifier devices 700, 800 (and others not shown in FIG. 3) have substantially similar gains.

Apparatus 600 also includes a modeling circuit 320 and a comparing circuit 322 that are each substantially similar to modeling circuit 320 and comparing circuit 322 described in connection with FIG. 2. Modeling circuit 320 includes an input modeling section 324 and an amplifier modeling section 326. Input modeling section 324 is configured to model input signals $IN_{P1}$, $IN_{N1}$ received at input loci 702, 704 in amplifier device 700 and to model input signals $IN_{P2}$, $IN_{N2}$ received at input loci 802, 804 in amplifier device 800. Input signals $IN_{P1}$, $IN_{N1}$ and $IN_{P2}$, $IN_{N2}$ are received from an amplifier stage preceding amplifier devices 700, 800, in the manner of input signals received at input loci 42, 44 (FIG. 1). Input modeling section 324 includes a resistor coupled in series with an NPN transistor $Q_0$ and a current source 330 between input voltage supply locus 633 and ground 619. Transistor $Q_0$ has a collector 332, an emitter 334 and a base 336. Transistor $Q_0$ is diode-configured with collector 332 and gate 336 connected together.

Amplifier modeling section 326 includes a PMOS transistor $MP_1$ coupled with input voltage supply locus 532. Transistor $MP_1$ has a source 338, a drain 340 and a gate 342. Source 338 is coupled with input voltage supply locus 532. Drain 340 is coupled with a pair of parallel-connected NPN transistors $Q_3$, $Q_4$. Transistor $Q_3$ has a collector 344, an emitter 346 and a base 348. Transistor $Q_4$ has a collector 350, an emitter 352 and a base 354. Collectors 344, 350 are coupled with drain 340. Base 348 is coupled with a locus 349 between transistor $Q_0$ and current source 330. Base 354 is coupled with a locus 353 between transistor $Q_0$ and current source 330. In this manner, bases 348, 354 receive substantially the same modeled input signals. Emitters 346, 352 are coupled with ground 619 via an NPN transistor $Q_6$. Transistor $Q_6$ has a collector 356, an emitter 358 and a base 360. Collector 356 is coupled with emitters 346, 352. Emitter 358 is coupled with ground 619. A bias voltage $V_{BIAS}$ is applied to base 360 to control conducting operation by transistor $Q_6$. Emitters 346, 352 are also coupled with ground 619 via an NMOS transistor $MN_1$. Transistor $MN_1$ has a drain 362, a source 364 and a gate 366. Drain 362 is coupled with emitters 346, 352. Source 364 is coupled with ground 619.

Comparing circuit 322 includes a first circuit branch 370, a second circuit branch 372 and a third circuit branch 374 coupled in parallel between input voltage supply locus 633 and ground 619. First circuit branch 370 includes a PMOS transistor $MP_4$ and a reference current supply 376. Transistor $MP_4$ has a source 380, a drain 382 and a gate 384. Source 380 is coupled with input voltage supply locus 633. Reference current supply 376 is coupled between drain 382 and ground 619. Second circuit branch 372 includes a PMOS transistor $MP_3$ and an NMOS transistor $MN_4$. Transistor $MP_3$ has a source 386, a drain 388 and a gate 390. Transistor MN₄ has a drain 392, a source 394 and a gate 396. Source 386 is coupled with input voltage supply locus 633. Drain 388 is coupled with drain 392. Source 394 is coupled with ground 619. Third circuit branch 374 includes a PMOS transistor MP₂ and an NMOS transistor MN₃. Transistor MP₂ has a source 400, a drain 402 and a gate 404. Transistor MN₃ has a drain 406, a source 408 and a gate 410. Source 400 is coupled with input voltage supply locus 633. Drain 402 is coupled with drain 406. Source 408 is coupled with ground 619.

Figure 4:
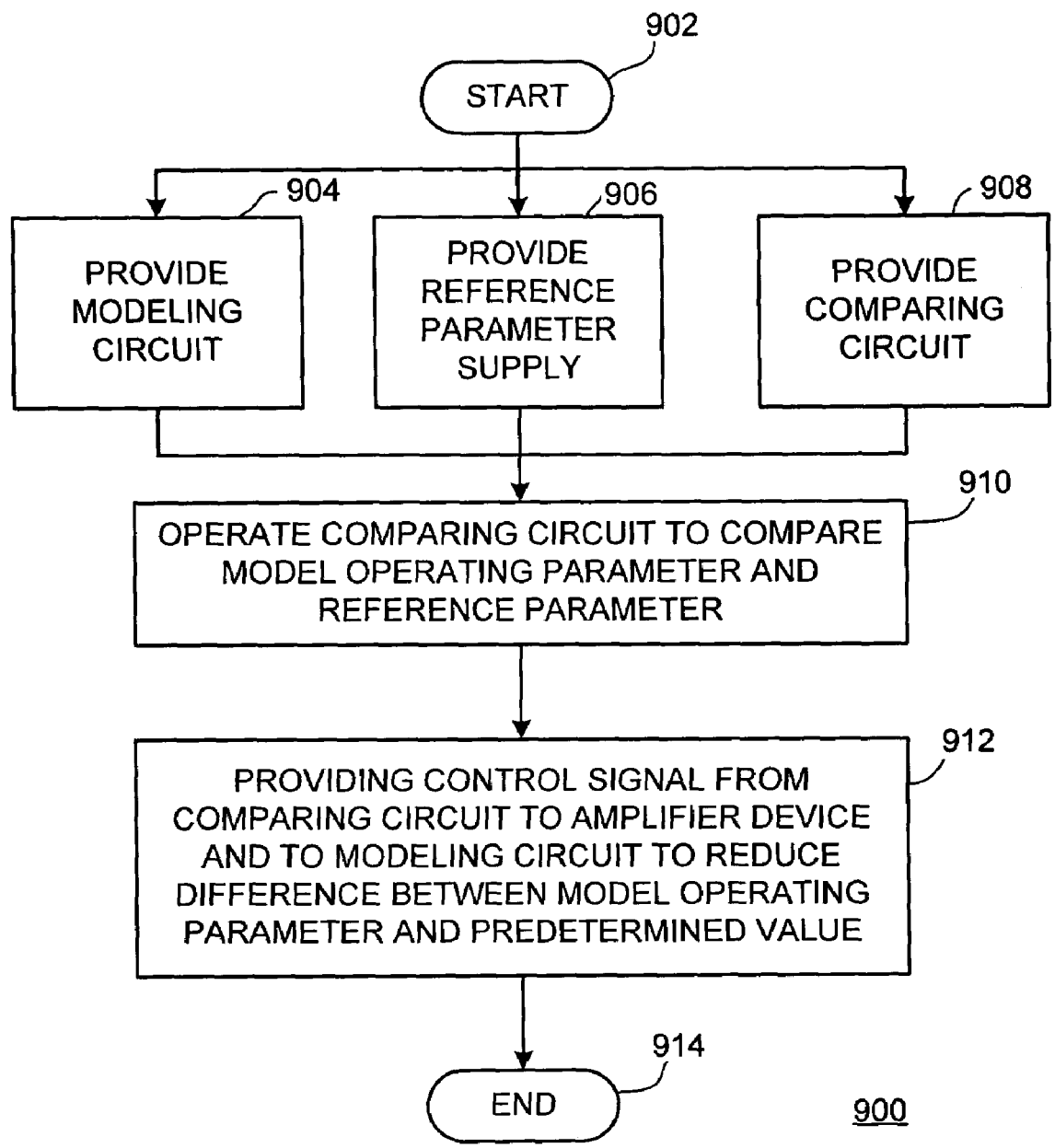
FIG. 4 is a flow chart illustrating the method of the present invention.

FIG. 4 is a flow chart illustrating the method of the present invention. In FIG. 4, a method 900 for controlling operation of an amplifier device when supply voltage provided to the amplifier device changes sufficiently at an input voltage supply locus to vary an operating parameter in the amplifier device from a predetermined value begins at a START locus 902. The operating parameter varies in generally direct proportion with the supply voltage. Method 900 continues with the step of, in no particular order: (1) Providing a modeling circuit coupled with the input voltage supply locus, as indicated by a block 904. The modeling circuit produces a model operating parameter substantially modeling the operating parameter. (2) Providing a reference parameter supply. The reference parameter supply provides a reference parameter, as indicated by a block 906. (3) Providing a comparing circuit coupled with the reference parameter supply and coupled with the modeling circuit, as indicated by a block 908.

Method 900 continues with the step of operating the comparing circuit to compare the model operating parameter with the reference parameter, as indicated by a block 910.

Method 900 continues with the step of providing a control signal from the comparing circuit to the modeling circuit and to the amplifier device in response to the comparing, as indicated by a block 912. The control signal alters operation of the modeling circuit and the amplifier device to effect changing the model operating parameter when the model operating parameter differs from the predetermined value to reduce difference between the model operating parameter and the predetermined value.

Method 900 terminates at an END locus 914.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims.

We claim:

1. An apparatus for controlling operation of an amplifier device when supply voltage provided to said amplifier device varies at an input voltage supply locus; said amplifier device having an operating parameter varying in generally direct proportion with said supply voltage; the apparatus comprising:
   (a) a reference parameter supply; said reference parameter supply providing a reference parameter substantially similar to said operating parameter; said reference parameter being substantially independent of variance of said supply voltage;
   (b) a modeling circuit coupled with said input voltage supply locus; said modeling circuit substantially modeling said amplifier device;
   (c) a comparing circuit coupled with said modeling circuit and with said reference parameter supply; said comparing circuit receiving a model operating parameter from said modeling circuit; said model operating parameter substantially modeling said operating parameter; said comparing circuit receiving said reference parameter from said reference parameter supply; said comparing circuit comparing said model operating parameter with said reference parameter; said comparing circuit providing a control signal to said modeling circuit and to said amplifier device in response to said comparing; said control signal altering operation of said modeling circuit and said amplifier device; said altering reducing variance of a relation between said reference parameter and said model operating parameter from a predetermined relationship.

2. An apparatus for controlling operation of an amplifier device when supply voltage provided to said amplifier device varies at an input voltage supply locus as recited in claim 1 wherein said operating parameter is an operating current and wherein said reference parameter is a reference current.

3. An apparatus for controlling operation of an amplifier device when supply voltage provided to said amplifier device varies at an input voltage supply locus as recited in claim 1 wherein said amplifier device is included in a multi-stage amplifying apparatus having at least one earlier amplifier stage providing at least one input signal to said amplifier device and wherein said modeling circuit includes an input signal modeling circuit; said input signal modeling circuit generating at least one model input signal for said modeling circuit; said at least one model input signal representing said at least one input signal received by said amplifier device from a selected earlier amplifier stage of said at least one earlier amplifier stage.

4. An apparatus for controlling operation of an amplifier device when supply voltage provided to said amplifier device varies at an input voltage supply locus as recited in claim 1 wherein said amplifier device receives said control signal at a first switching device responsive to said control signal to vary said operating parameter in said amplifier device, and wherein said modeling device receives said control signal at a second switching device responsive to said control signal to vary said model operating parameter in said modeling device.

5. An apparatus for controlling operation of an amplifier device when supply voltage provided to said amplifier device varies at an input voltage supply locus as recited in claim 2 wherein said amplifier device is included in a multi-stage amplifying apparatus having at least one earlier amplifier stage providing at least one input signal to said amplifier device and wherein said modeling circuit includes an input signal modeling circuit; said input signal modeling circuit generating at least one model input signal for said modeling circuit; said at least one model input signal representing said at least one input signal received by said amplifier device from a selected earlier amplifier stage of said at least one earlier amplifier stage.

6. An apparatus for controlling operation of an amplifier device when supply voltage provided to said amplifier device varies at an input voltage supply locus as recited in claim 2 wherein said amplifier device receives said control signal at a first switching device responsive to said control signal to vary said operating parameter in said amplifier device, and wherein said modeling device receives said control signal at a second switching device responsive to said control signal to vary said model operating parameter in said modeling device.

7. An apparatus for controlling operation of an amplifier device when supply voltage provided to said amplifier device varies at an input voltage supply locus as recited in claim 3 wherein said amplifier device receives said control signal at a first switching device responsive to said control signal to vary said operating parameter in said amplifier device, and wherein said modeling device receives said control signal at a second switching device responsive to said control signal to vary said model operating parameter in said modeling device.

8. An apparatus for controlling operation of an amplifier device when supply voltage provided to said amplifier device varies at an input voltage supply locus as recited in claim 2 wherein said amplifier device is a differential signal amplifier device including two parallel networks handling substantially complementary differential signals; said two network being coupled with said input voltage supply locus and contributing to said operating current at a common locus.

9. An apparatus for controlling operation of an amplifier device when supply voltage provided to said amplifier device varies at an input voltage supply locus as recited in claim 8 wherein said amplifier device is included in a multi-stage amplifying apparatus having at least one earlier amplifier stage providing at least one input signal to said amplifier device and wherein said modeling circuit includes an input signal modeling circuit; said input signal modeling circuit generating at least one model input signal for said modeling circuit; said at least one model input signal representing said at least one input signal received by said amplifier device from a selected earlier amplifier stage of said at least one earlier amplifier stage.

10. An apparatus for controlling operation of an amplifier device when supply voltage provided to said amplifier device varies at an input voltage supply locus as recited in claim 9 wherein said amplifier device receives said control signal at a first switching device responsive to said control signal to vary said operating parameter in said amplifier device, and wherein said modeling device receives said control signal at a second switching device responsive to said control signal to vary said model operating parameter in said modeling device.

11. An apparatus for controlling operation of an amplifier device when supply voltage provided to said amplifier device varies sufficiently at an input voltage supply locus to reduce an operating parameter in said amplifier device below a predetermined value; said operating parameter varying in generally direct proportion with said supply voltage; the apparatus comprising:

(a) a modeling circuit coupled with said input voltage supply locus; said modeling circuit substantially modeling said amplifier device; and (b) a comparing circuit coupled with a reference parameter supply and coupled with said modeling circuit; said comparing circuit receiving a model operating parameter from said modeling circuit; said model operating parameter substantially modeling said operating parameter; said comparing circuit receiving a reference parameter from said reference parameter supply; said comparing circuit comparing said model operating parameter with said reference parameter; said comparing circuit providing a control signal to said modeling circuit and to said amplifier device in response to said comparing; said control signal altering operation of said modeling circuit and said amplifier device; said altering increasing said model operating parameter when said model operating parameter is below said predetermined value.

12. An apparatus for controlling operation of an amplifier device when supply voltage provided to said amplifier device varies sufficiently at an input voltage supply locus to reduce an operating parameter in said amplifier device below a predetermined value as recited in claim 11 wherein said operating parameter is an operating current and wherein said reference parameter is a reference current.

13. An apparatus for controlling operation of an amplifier device when supply voltage provided to said amplifier device varies sufficiently at an input voltage supply locus to reduce an operating parameter in said amplifier device below a predetermined value as recited in claim 11 wherein said amplifier device is included in a multi-stage amplifying apparatus having at least one earlier amplifier stage providing at least one input signal to said amplifier device and wherein said modeling circuit includes an input signal modeling circuit; said input signal modeling circuit generating at least one model input signal for said modeling circuit; said at least one model input signal representing said at least one input signal received by said amplifier device from a selected earlier amplifier stage of said at least one earlier amplifier stage.

14. An apparatus for controlling operation of an amplifier device when supply voltage provided to said amplifier device varies sufficiently at an input voltage supply locus to reduce an operating parameter in said amplifier device below a predetermined value as recited in claim 11 wherein said amplifier device receives said control signal at a first switching device responsive to said control signal to vary said operating parameter in said amplifier device, and wherein said modeling device receives said control signal at a second switching device responsive to said control signal to vary said model operating parameter in said modeling device.

15. An apparatus for controlling operation of an amplifier device when supply voltage provided to said amplifier device varies sufficiently at an input voltage supply locus to reduce an operating parameter in said amplifier device below a predetermined value as recited in claim 12 wherein said amplifier device is a differential signal amplifier device including two parallel networks handling substantially complementary differential signals; said two network being coupled with said input voltage supply locus and contributing to said operating current at a common locus.

16. An apparatus for controlling operation of an amplifier device when supply voltage provided to said amplifier device varies sufficiently at an input voltage supply locus to reduce an operating parameter in said amplifier device below a predetermined value as recited in claim 15 wherein said amplifier device is included in a multi-stage amplifying apparatus having at least one earlier amplifier stage providing at least one input signal to said amplifier device and wherein said modeling circuit includes an input signal modeling circuit; said input signal modeling circuit generating at least one model input signal for said modeling circuit; said at least one model input signal representing said at least one input signal received by said amplifier device from a selected earlier amplifier stage of said at least one earlier amplifier stage.

17. An apparatus for controlling operation of an amplifier device when supply voltage provided to said amplifier device varies sufficiently at an input voltage supply locus to reduce an operating parameter in said amplifier device below a predetermined value as recited in claim 16 wherein said amplifier device receives said control signal at a first switching device responsive to said control signal to vary said operating parameter in said amplifier device, and wherein said modeling device receives said control signal at a second switching device responsive to said control signal to vary said model operating parameter in said modeling device.

18. An apparatus for controlling operation of an amplifier device when supply voltage provided to said amplifier device varies sufficiently at an input voltage supply locus to reduce an operating parameter in said amplifier device below a predetermined value as recited in claim 11 wherein said amplifier device comprises a plurality of amplifier units.

19. An apparatus for controlling operation of an amplifier device when supply voltage provided to said amplifier device varies sufficiently at an input voltage supply locus to reduce an operating parameter in said amplifier device below a predetermined value as recited in claim 18 wherein each respective amplifier unit of said plurality of amplifier units receives said control signal at a respective first switching device responsive to said control signal to vary said operating parameter in said respective amplifier unit, and wherein said modeling device receives said control signal at a second switching device responsive to said control signal to vary said model operating parameter in said modeling device.

20. A method for controlling operation of an amplifier device when supply voltage provided to said amplifier device changes sufficiently at an input voltage supply locus to vary an operating parameter in said amplifier device from a predetermined value; said operating parameter varying in generally direct proportion with said supply voltage; the method comprising the steps of:

(a) in no particular order:
  (1) providing a modeling circuit coupled with said input voltage supply locus; said modeling circuit producing a model operating parameter substantially modeling said operating parameter;
  (2) providing a reference parameter supply; said reference parameter supply providing a reference parameter; and
  (3) providing a comparing circuit coupled with said reference parameter supply and coupled with said modeling circuit;

(b) operating said comparing circuit to compare said model operating parameter with said reference parameter;

(c) providing a control signal from said comparing circuit to said modeling circuit and to said amplifier device in response to said comparing; said control signal altering operation of said modeling circuit and said amplifier device; said altering changing said model operating parameter when said model operating parameter differs from said predetermined value to reduce difference between said model operating parameter and said predetermined value.

* * * * *